(12) United States Patent
Iwaki

(10) Patent No.: US 7,402,782 B2
(45) Date of Patent: Jul. 22, 2008

(54) BAKING DEVICE AND BAKING METHOD OF BAKING A CHEMICALLY AMPLIFIED RESIST FILM CONTAINING AN ACID ($H^+$) GENERATOR BEFORE EXPOSURE BUT AFTER DEVELOPMENT

(75) Inventor: Hiroyuki Iwaki, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 284 days.

(21) Appl. No.: 11/266,215

(22) Filed: Nov. 4, 2005

(65) Prior Publication Data
US 2006/0096976 A1    May 11, 2006

(30) Foreign Application Priority Data
Nov. 8, 2004    (JP)    ............... 2004-323335

(51) Int. Cl.
*H05B 6/10*    (2006.01)
*G03F 7/38*    (2006.01)

(52) U.S. Cl. .............. 219/635; 219/670; 118/302; 392/416; 430/328; 438/758

(58) Field of Classification Search ............... 219/635, 219/645, 647, 649, 670, 662, 632; 392/416, 392/418; 430/328, 330; 438/758; 118/302
See application file for complete search history.

(56) References Cited

U.S. PATENT DOCUMENTS

| | | | |
|---|---|---|---|
| 6,279,502 B1* | 8/2001 | Azuma | 118/663 |
| 6,290,824 B1* | 9/2001 | Ishikawa et al. | 118/719 |
| 6,841,342 B2 | 1/2005 | Nishi et al. | |

FOREIGN PATENT DOCUMENTS

| | | |
|---|---|---|
| JP | 07-106235 | 4/1995 |
| JP | 11-335833 | * 12/1999 |
| JP | 2001-85323 | 3/2001 |

* cited by examiner

*Primary Examiner*—Philip H Leung
(74) *Attorney, Agent, or Firm*—Smith, Gambrell & Russell, LLP

(57) ABSTRACT

A heat treatment device for baking a chemically amplified resist film formed on a substrate after exposure but before development includes a table that supports the substrate, a heater that heats the substrate, a magnetic field generating unit that generates a magnetic field of lines of magnetic flux directed in a film thickness direction of the resist film and reverses the direction of the lines of magnetic flux, and a controller unit that controls the magnetic field generating unit to generate the magnetic field acting on the resist film at least while the substrate is being heated by the heater unit.

16 Claims, 6 Drawing Sheets

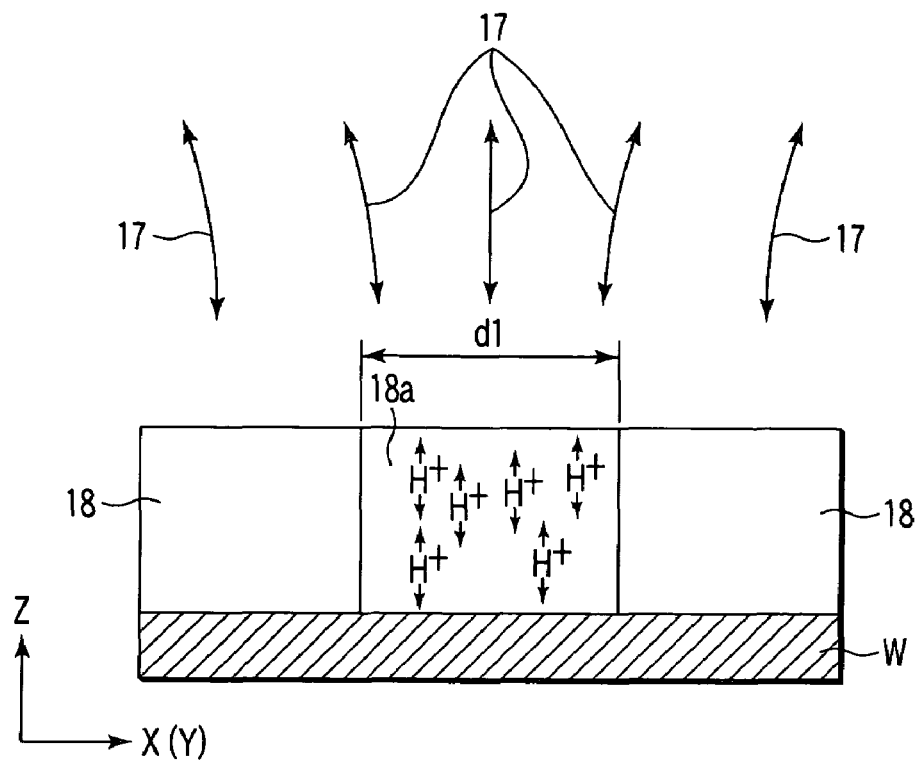
F I G. 6A
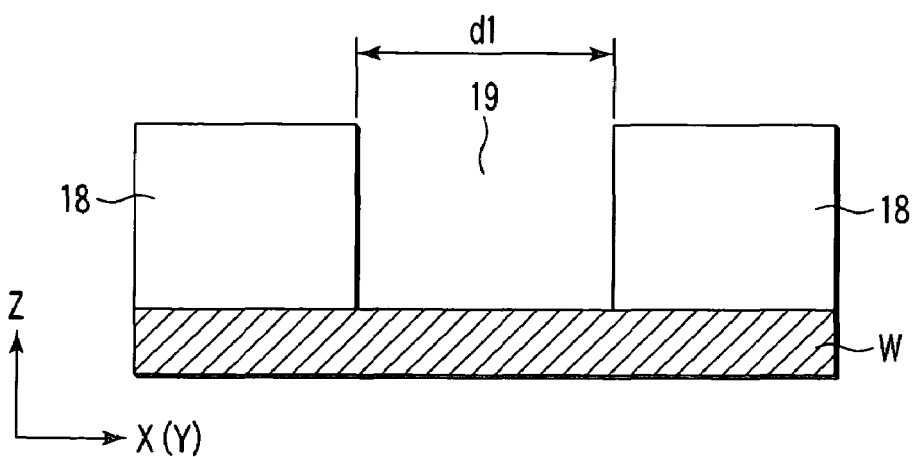
F I G. 6B

BAKING DEVICE AND BAKING METHOD OF BAKING A CHEMICALLY AMPLIFIED RESIST FILM CONTAINING AN ACID (H$^+$) GENERATOR BEFORE EXPOSURE BUT AFTER DEVELOPMENT

CROSS-REFERENCE TO RELATED APPLICATIONS

This application is based upon and claims the benefit of priority from prior Japanese Patent Application No. 2004-323335, filed Nov. 8, 2004, the entire contents of which are incorporated herein by reference.

BACKGROUND OF THE INVENTION

1. Field of the Invention

The present invention relates to a heat treatment device used for PEB (post exposure baking), which bakes a process material film applied on a substrate such as a semiconductor wafer or glass substrate for liquid crystal display after exposure but before development, and such a heat treatment method.

2. Description of the Related Art

In the manufacture of semiconductor devices, a desired circuit pattern is formed on each semiconductor wafer using the so-called photolithography process. In the photolithography, each semiconductor wafer is subjected to a series of processes including washing, dry baking, adhesion (process to make the wafer water-repellent), resist application, pre-baking, exposure, post-exposure baking (PEB), development and post-baking, which are carried out in this order.

The above-described photolithography process has to deal with a very thin line width of the circuit pattern. Therefore, a chemically amplified resist that contains a polymer that transforms to be alkali-soluble in the presence of acid and an acid generator is used.

By referring to FIGS. 1A and 1B, a conventional pattern formation method that uses a chemical amplified resist will now be described. First, a chemically amplified resist 18 is applied to a wafer W. The resist 18 is, for example, a KrF resist (a type of chemically amplified resist) that contains an onium salt as the acid generator, and polyvinylphenol protected by a tert-butoxycarbonyl group (t-BOC), as the polymer.

Next, as shown in FIG. 1A, a KrF excimer laser beam 15 is applied to the resist 18 via a mask 16, and thus the resist 18 is exposed to form a pattern. When the KrF excimer laser beam 15 is applied to the resist 18, an acid (H$^+$) or positive ion is generated from the acid generator in the resist 18.

After the exposure but before the development, when the resist 18 is heated in the PEB step, the acid (H$^+$) reacts with the t-BOC group. Due to this reaction, the t-BOC group is decomposed to generate a phenolic hydroxide group and an acid (H$^+$). Due to the decomposition of the t-BOC group, the acid (H$^+$) is newly generated and thus the number of positive ions (H$^+$) increases. Consequently, the reaction proceeds in a chain reaction manner (chemical amplification reaction). As described, in the chemically amplified resist 18, the positive ions (H$^+$) serve as a catalyst, and thereby the sensitivity is improved.

In the developing step, which follows, an alkali developing solution (for example, TMAH solution) is brought into contact with the resist 18 to dissolve an exposed section 18$a$, which is now rendered alkali-soluble, and remove it. Thus, a positive-type resist pattern 19 as shown in FIG. 1B is obtained.

It should be noted here that after carrying out the post-exposure baking (PEB), the resist must be cooled down in a short period of time. Otherwise, the chemical amplification reaction proceeds more than needed, causing a problem of creating an adverse affect on the width of the pattern line ultimately formed. Further, if the time period until the cooling process starts after the PEB varies from one occasion to another, the width of the line varies from one wafer W to another accordingly, which is not desired.

Jpn. Pat. Appln. KOKAI Publication No. 2001-85323 discloses such a technique that substrates to be processed are cooled down while they are carried by means of a cooling unit equipped in a carriage unit for carrying the substrates. With this conventional technique, the cooling process can be started within such a short time after the heating process of the wafers, and therefore the temperature distribution within the wafer surface can be made even, thereby making it possible to improve the yield of the products.

Incidentally, the post-exposure pre-developing baking (PEB) is a process that is carried out to promote the reaction of the acid in the chemically amplified resist, and therefore the decomposition of the protection group (t-BOC group) by the acid (H$^+$) is promoted. For example, as shown in FIG. 2A, in the initial stage of the reaction, the acid (H$^+$) diffuses in random directions within the range of a mask pattern width d1, to attack the protection group (t-BOC group).

However, the diffusion of the acid (H$^+$) proceeds not only in the film thickness direction (Z-direction) but also in the film surface direction (X or Y direction) or a diagonal direction. Consequently, the diffusion of the acid (H$^+$) proceeds beyond the mask pattern width d1 (the target pattern line width) during the PEB process as shown in FIG. 2B. FIG. 2C shows the results, in which a pattern line width d2 after the development becomes larger than the mask pattern width d1.

As described above, the conventional technique cannot control the progression of the chemical amplification reaction during the post-exposure and pre-development baking (PEB), and therefore it entails such a drawback that the line width of a circuit pattern ultimately obtained is larger than the target pattern line width.

BRIEF SUMMARY OF THE INVENTION

The object of the present invention is to provide a heat treatment device that can obtain a desired target pattern width in a PEB process of the manufacture of a chemically amplified resist film, and such a heat treatment method.

According to an aspect of the present invention, there is provided a heat treatment device for baking a chemically amplified process material film containing an acid (H$^+$) generator, the device comprising: a supporting unit that supports a substrate containing the process material film; a heating unit that heats the substrate supported by the supporting unit; a magnetic field generating unit that generates a magnetic field of lines of magnetic flux directed in a film thickness direction of the process material film and reverses the direction of the lines of magnetic flux in the magnetic field; and a control unit that controls the magnetic field generating unit to generate the magnetic field acting on the process material film at least while the substrate is being heated by the heating unit.

With this aspect of the invention, the magnetic field having magnetic lines of induction running in the film thickness direction of the process material film is made to act upon the process material film, and thus the diffusing direction of the acid (H$^+$) in the process material film can be controlled. That is, the acid (H$^+$) are acted upon in the direction of the magnetic lines of induction such that they are not diffused in the horizontal direction (film surface direction), but diffused in the film thickness direction. Further, the up and down directions of the magnetic field that runs normal to the surface of the substrate are reversed periodically, and therefore the diffusing direction of the acid ($H^+$) in the process material film can be equalized in the up and down directions. Consequently, an excessive increase in the line width of the circuit pattern can be inhibited, and therefore a desired line width of a mask pattern can be obtained after the development.

It is preferable that the magnetic field generating unit should include a coil arranged above or underneath the substrate, and a power supply that supplies an electrical current to the coil. With this structure, a magnetic field having lines of magnetic flux running in the film thickness direction of the process material film can be generated and the direction of the magnetic field can be periodically or non-periodically reversed by changing the direction of the flow of the current.

Further, according to the present invention, the heat treatment device may include a cooling unit that receives the substrate heated by the heating unit and cools down the substrate. In this case, the control unit stops operation of the magnetic field generating unit while the substrate is being cooled down by the cooling unit, or the control unit stops operation of the magnetic field generating unit when the substrate is cooled down to a predetermined temperature after starting of cooling-down of the substrate by the cooling unit.

In the manner, it is possible to cool down the substrate immediately after the heat treatment, and therefore an excessive chemical amplification reaction that continues after the heat treatment can be inhibited. Alternatively, it can be controlled such that the magnetic field generating means operates only during the acid diffusion reaction.

According to another aspect of the present invention, there is provided a heat treatment method of baking a chemically amplified process material film that containing an acid ($H^+$) generator, before exposure but after development, the method comprising: (a) heating a substrate containing the process material film; and (b) generating a magnetic field of lines of magnetic flux directed in a film thickness direction of the process material film and reversing the direction of the lines of magnetic flux in the magnetic field, thereby making the magnetic field act on the process material film at least while the substrate is being heated by the heating unit.

With this aspect of the invention, the magnetic field having magnetic lines of induction running in the film thickness direction of the process material film is made to act upon the process material film, and thus the diffusing direction of the acid ($H^+$) in the process material film can be controlled. That is, the acid ($H^+$) are acted upon in the direction of the magnetic lines of induction such that they are not diffused in the horizontal direction (film surface direction), but diffused in the film thickness direction.

Thus, the acid elements are not diffused in the horizontal direction, but they are diffused in the direction normal to the surface of the substrate to be treated.

[Additional objects and advantages of the invention will be set forth in the description which follows, and in part will be obvious from the description, or may be leaned by practice of the invention. The objects and advantages of the invention may be realized and obtained by means of the instrumentalities and combinations particularly pointed out hereinafter.]

BRIEF DESCRIPTION OF THE SEVERAL VIEWS OF THE DRAWING

[The accompanying drawings, which are incorporated in and constitute a part of the specification, illustrate embodiments of the invention, and together with the general description given above and the detailed description of the embodiments given below, serve to explain the principles of the invention.]

FIG. 6A is a diagram schematically showing a cross section of a chemically amplified resist application film in a PEB step in a heat treatment method according to an embodiment of the present invention;

FIG. 6B is a diagram schematically showing a cross section of the chemically amplified resist application film after development in the heat treatment method according to the embodiment of the present invention.

DETAILED DESCRIPTION OF THE INVENTION

The best modes to carry out the present invention will now be described with reference to accompanying drawings.

Figure 1A:
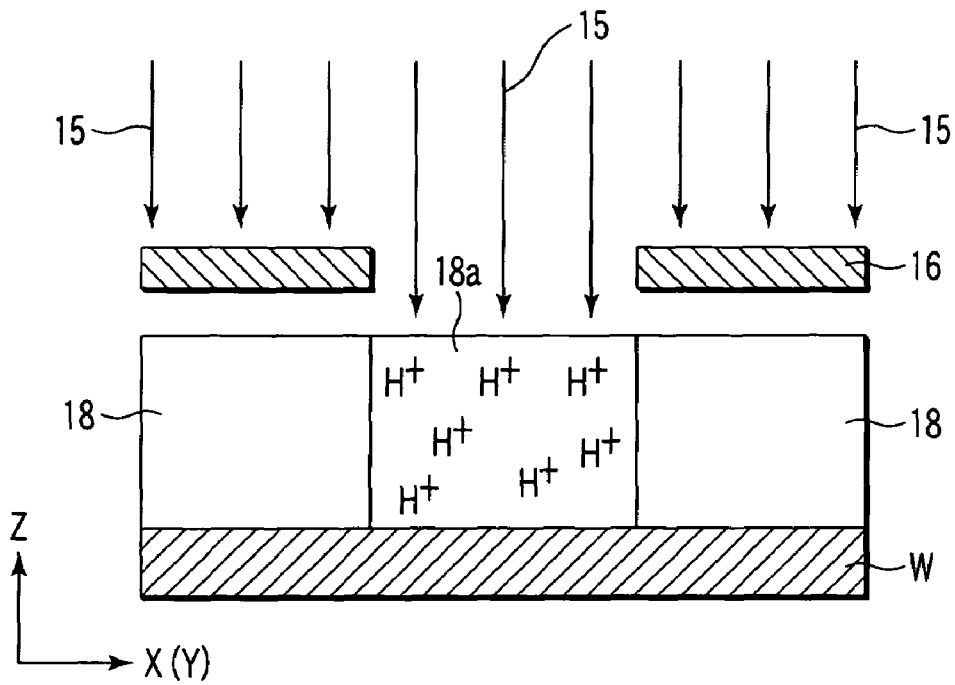
FIG. 1A is a diagram schematically showing a cross section of a chemically amplified resist application film in an exposure step of a conventional process.
Figure 1B:
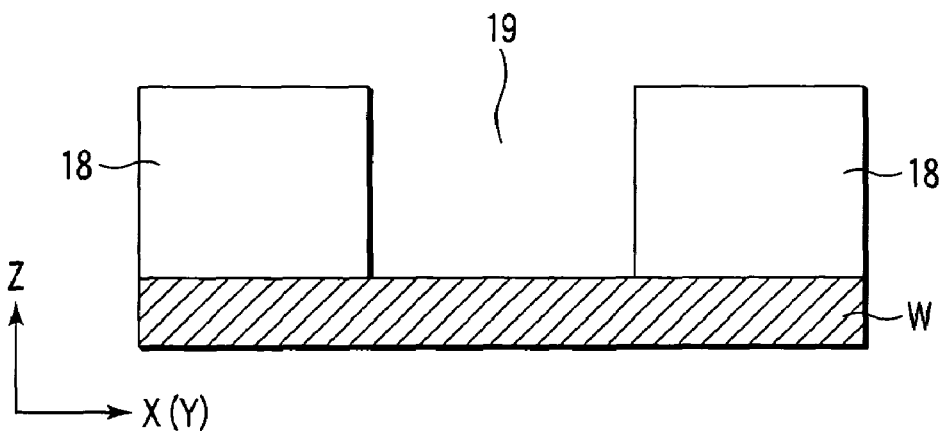
FIG. 1B is a diagram schematically showing a cross section of the chemically amplified resist application film after a development in the conventional process.
Figure 2A:
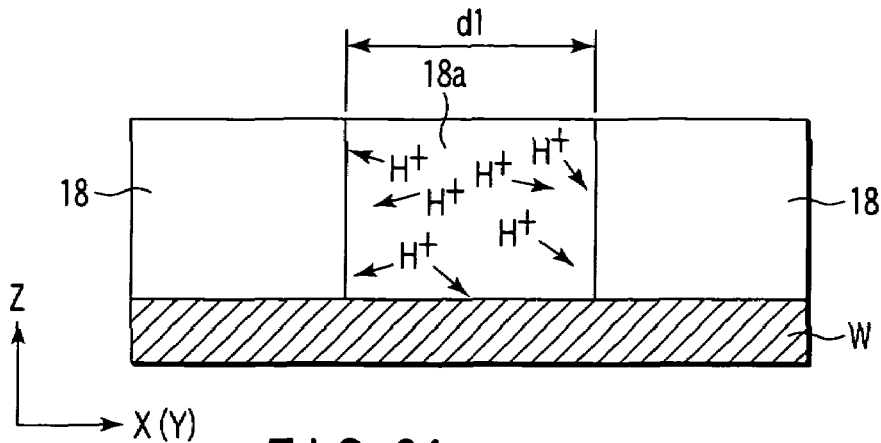
FIGS. 2A and 2B each are a diagram schematically showing a cross section of the chemically amplified resist application film in a PEB step of the conventional process.
Figure 2B:
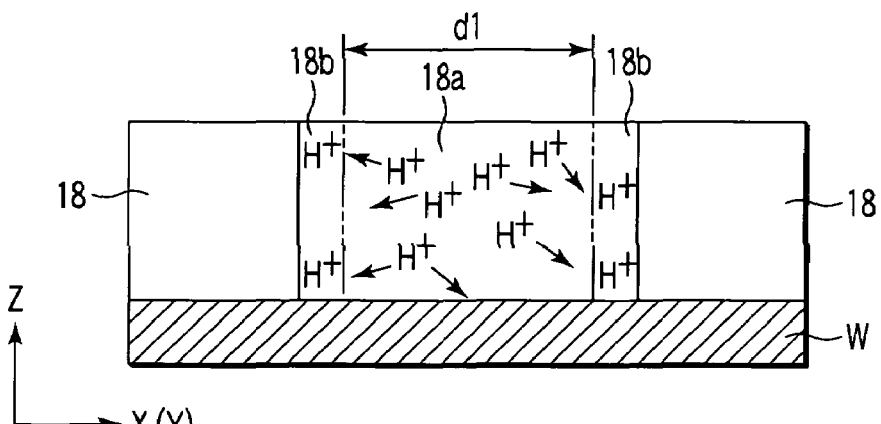
Figure 2C:
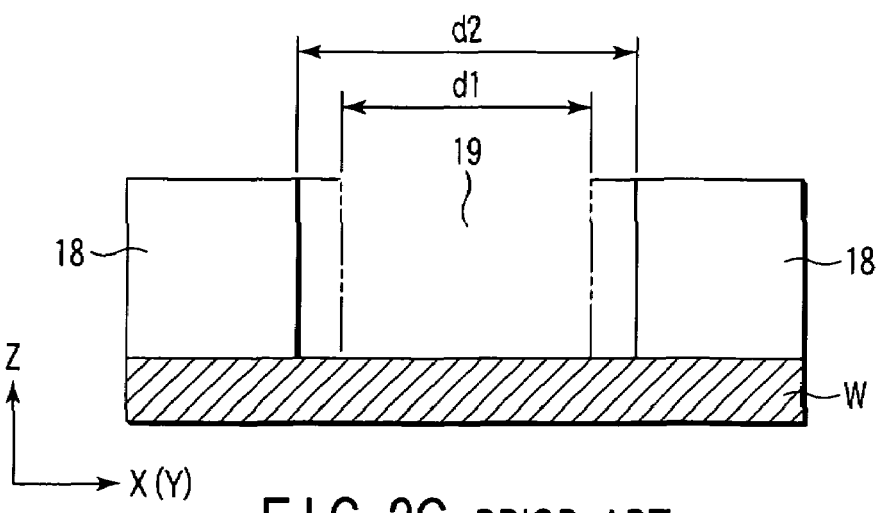
FIG. 2C is a diagram schematically showing a cross section of the chemically amplified resist application film after the development in the conventional process.
Figure 3:
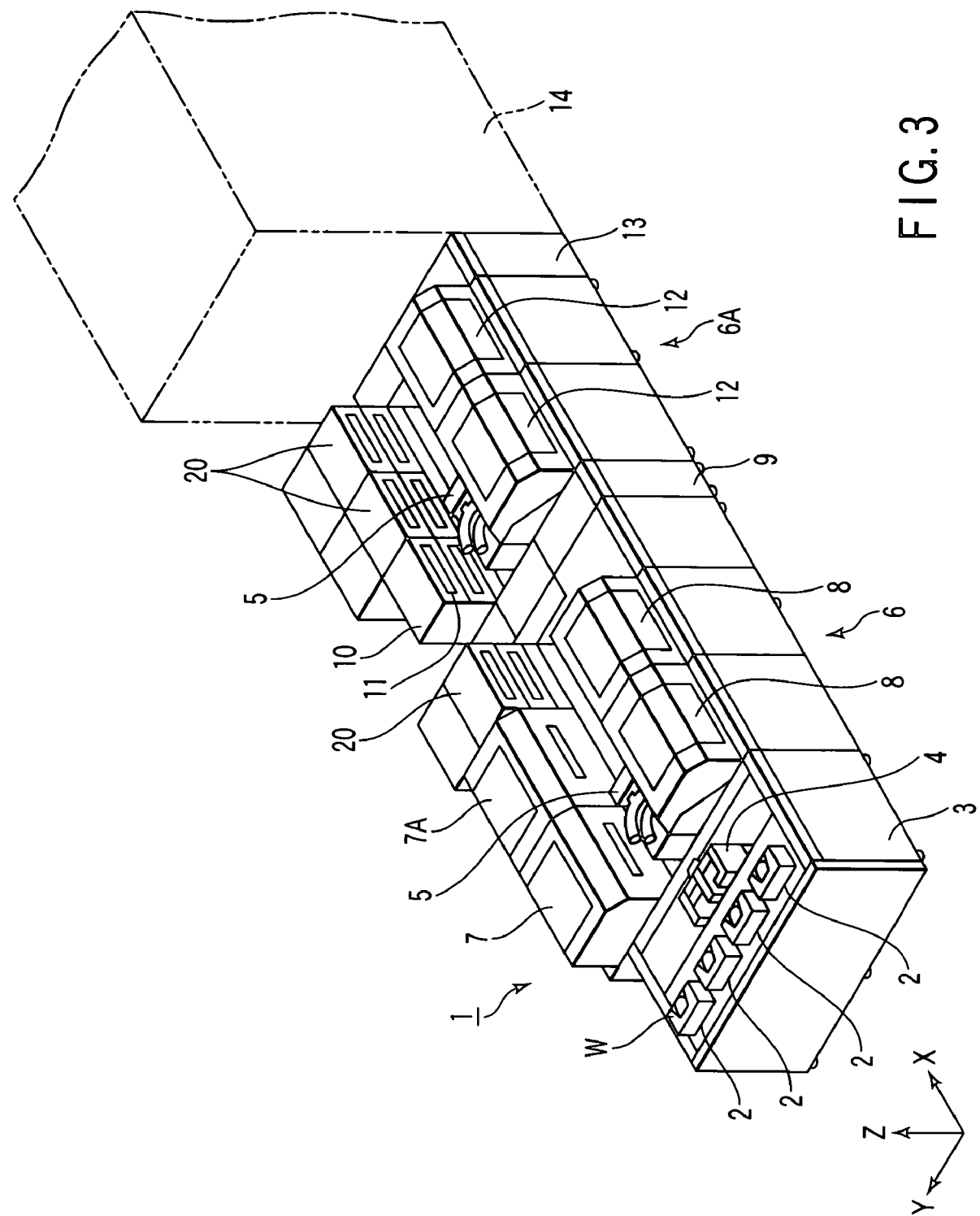
FIG. 3 is a perspective view briefly showing an entire resist application development processing system equipped with a heat treatment device according to an embodiment of the present invention.

As shown in FIG. 3, a resist application development processing system 1 includes a carrier station 3, a first process station 6, a connection unit 9, a second process station and an interface unit 13. The processing system 1 is connected to an exposure device 14 via the interface unit 13.

The carrier station 3 is arranged on a front end side of the processing system 1, and it includes a placement table on which is placed a plurality (for example, four) of cassettes 2 each containing a plurality of semiconductor wafers W. An auxiliary arm 4 is provided to be movable along the cassette placement table. The auxiliary arm 4 is designed to load or unload a wafer W into or from a cassette 2, and then align the wafer W with respect to the process station 6 or 6A.

The first process station 6 is connected to a rear end side of the carrier station 3. The first processing station 6 includes a plurality of processing mechanisms 7, 7a, 8, 12 and 20 and a main arm 5. The main arm 5 is provided to be movable along a carrying path that extends in an X direction, and it is designed to pass wafers W between the auxiliary arm 4 and itself.

The processing mechanisms 7, 7A, 8, 12 and 20 are arranged on the respective sides along the carrying path of the main arm 5. More specifically, the brush scrubber 7 and the high-pressure jet washer 7A are arranged on the same side of the carrying path to be adjacent to each other. The brush scrubber 7 is designed to scrub the surface of a wafer W with the brush, and the high-pressure jet washer 7A is designed to wash the surface of a wafer W with a high-pressure water jet. Two heat treatment devices 20 are stacked one on another in the vertical direction next to the high-pressure water jet washer 7A. Further, two development devices 8 are arranged to be adjacent to each other on the opposite side of the carrying path of the main arm 5.

Further, the second process station 6A is connected to a rear section of the first process station 6 via the connection unit 9. The second process station 6A includes an adhesion device 10, a cleaning device 11, a heat treatment device 20 and a resist application device 12.

The adhesion device 10 is designed to make the surface of a wafer W water-repellent before the application of a resist. The cooling device 11 is arranged underneath the adhesion device 10 and it is designed to cool down the respective wafer W. Further, a plurality of heat treatment devices 20 are provided on one side of these devices 10 and 11. The heat treatment devices are arranged to be stacked one on another in two stories in two lines.

The two resist application devices 12 are arranged to be adjacent to each other on the other side of the carrying path of the main arm 5 to opposite the heat treatment devices 20 and the adhesion device 10. The resist application devices 12 are each designed to apply a resist to a wafer W. Further, the exposure device 14 is provided on one side of the resist application devices 12 via the interface unit 13.

A flow of processing steps of the above-described resist application development processing system 1 will now be briefly explained.

First, an unprocessed wafer W is picked up from a cassette 2 with the auxiliary arm 4, and it is conveyed by the main arm 5 to the brush scriber 7 and then to the high-pressure water jet 7A, where the surface of the wafer W is washed.

The washed wafer W is conveyed by the main arm 5 to one of the heat treatment devices 20, where it is heated and dried. After that, the wafer W is cooled down by the cooling device 11, and then it is conveyed to the adhesion device 10, where the wafer W is subjected to a process of making it water-repellant. After the process of imparting the water-repellant properties to the wafer W, it is conveyed to the resist application device 12, where the surface of the wafer W is coated with a resist by a spin coating method. In this embodiment, for example, a device with the product name UV135 from the Rohm and Haas Company can be used as the KrF photoresist.

Next, the wafer W is conveyed to another heat treatment device 20, where it is pre-baked for a predetermined time period at a predetermined temperature (for example, about 80° C.) in order to evaporate the solvent from the resist film. After that, the wafer W is cooled down to, for example, room temperature (about 23° C.), and conveyed to the exposure device 14, where it is subjected to the exposure step.

After the exposure step, the wafer W is conveyed to still another heat treatment device 20, where it is subjected to the PEB process for a predetermined time period at a predetermined temperature (for example, about 140° C.). After the PEB process, the wafer W is conveyed to still another heat treatment device 20, where it is post-baked for a predetermined time period at a predetermined temperature (50 to 180° C.). By the post-baking process, the liquid content remaining in the resist after the development is evaporated.

After that, the wafer W is conveyed to the cooling device, where it is cooled down to, for example, room temperature (about 23° C.), and thus the temperature of the wafer is adjusted appropriately. After that, the wafer W is transferred to the next step.

Here, the heat treatment device will now be described in detail with reference to FIG. 4.

Each heat treatment device 20 includes a heat treatment unit 21 and a standby unit 22. The heat treatment unit 21 is designed to heat a wafer W conveyed there by the main arm 5 to a predetermined temperature. Conversely, the standby unit 22 includes a cooling temperature adjusting member 40 that receives the heated wafer W and cools it down to a predetermined temperature (for example, room temperature [about 23° C.]).

The heat treatment unit 21 further includes a table 24 containing a heater 23 and a holder member 25 that holds the table 24. The heater 23 is embedded in the table 24 and connected to a power supply 54, and it is designed to heat a wafer W placed on the table 24. The holder member 25 holds the table 24 by its edge portion, and the member 25 itself is fixed to a frame, which is not shown in the figure.

A shutter 26 is provided to surround the edge portion of the table 24.

The shutter 26 has a cylindrical shape and is supported to be movable in a Z-direction by an ascending/descending cylinder 37. A cover 28 having a ventilation hole 28a that communicates with a ventilation device (not shown) is provided above the table 24. The cover 28 and the shutter 26 form a treatment chamber 30 of the heat treatment unit 21.

It should be noted that the treatment chamber 30 is formed such that a gap 31 of about 1 mm is made between an upper end of the shutter and the cover 28 to cause the air entering from the gap 31 into the treatment chamber 30 to be discharged from the ventilation hole 28a. Thus, the air is introduced from the upper and circumferential direction of the wafer W into the treatment chamber 30 and then discharged from the ventilation hole 28a provided at an upper central portion of the chamber. With this structure, it is possible to prevent the introduced air from being brought into direct contact with the wafer W. In this manner, the temperatures of the wafers W heated in the PEB step can be made even.

A flange 26a is formed to be directed inward at a lower end portion of the shutter 26. With this structure, as the shutter 26 is made to ascend by the ascending/descending cylinder 37, the inward flange 26a is brought into air-tight contact with a seal packing 29 mounted on a lower surface of the table holder member 25. In this state, the shutter 26, while enclosing the table 24, cooperates with the cover 28 to form the treatment chamber 30. On the other hand, when the shutter 26 descends, a wafer W is loaded into the treatment chamber 30 through the gap made between the upper end portion of the shutter 26 and the lower portion of the cover 28, and placed on the table 24. This wafer W is thereby brought by the main arm 5 from some section other than the standby unit 22.

Three lift pins 32 are provided underneath the table 24. These lift pins 32 are supported by an ascending/descending plate 33 which ascends/descends as driven by the ascending/descending mechanism 34, and these pins are inserted respectively into through holes 24a of the table 24. When the ascending/descending plate 33 is made to ascend by the ascending/descending mechanism 34, the lift pins 32 are made to project upward from the upper surface of the table 24 to as to push the wafer W upwards from the table 24.

It should be noted that the three lift pins 32 are mounted to stand in a coaxial manner on the ascending/descending plate 33. The lift pins 32 are each made of a heat insulating member such as ceramic, fluorine-based resin or synthesized rubber. The ascending/descending mechanism 34 is a ball screw mechanism 34 including a ball and nut type member coupled to the ascending/descending plate 33, and a screw.

Figure 4:
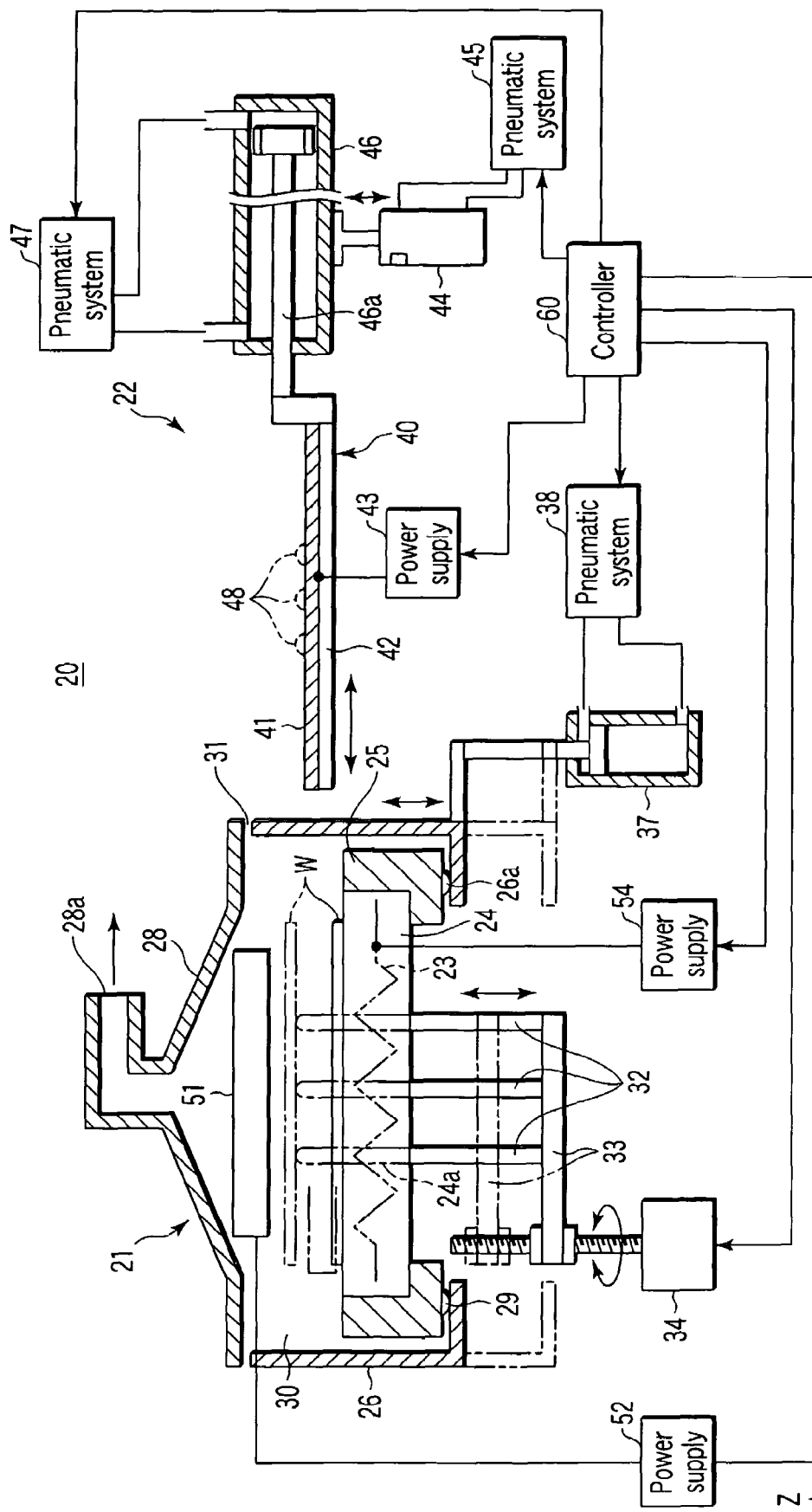
FIG. 4 is a block diagram schematically showing the heat treatment device according to the embodiment of the present invention.
Figure 5:
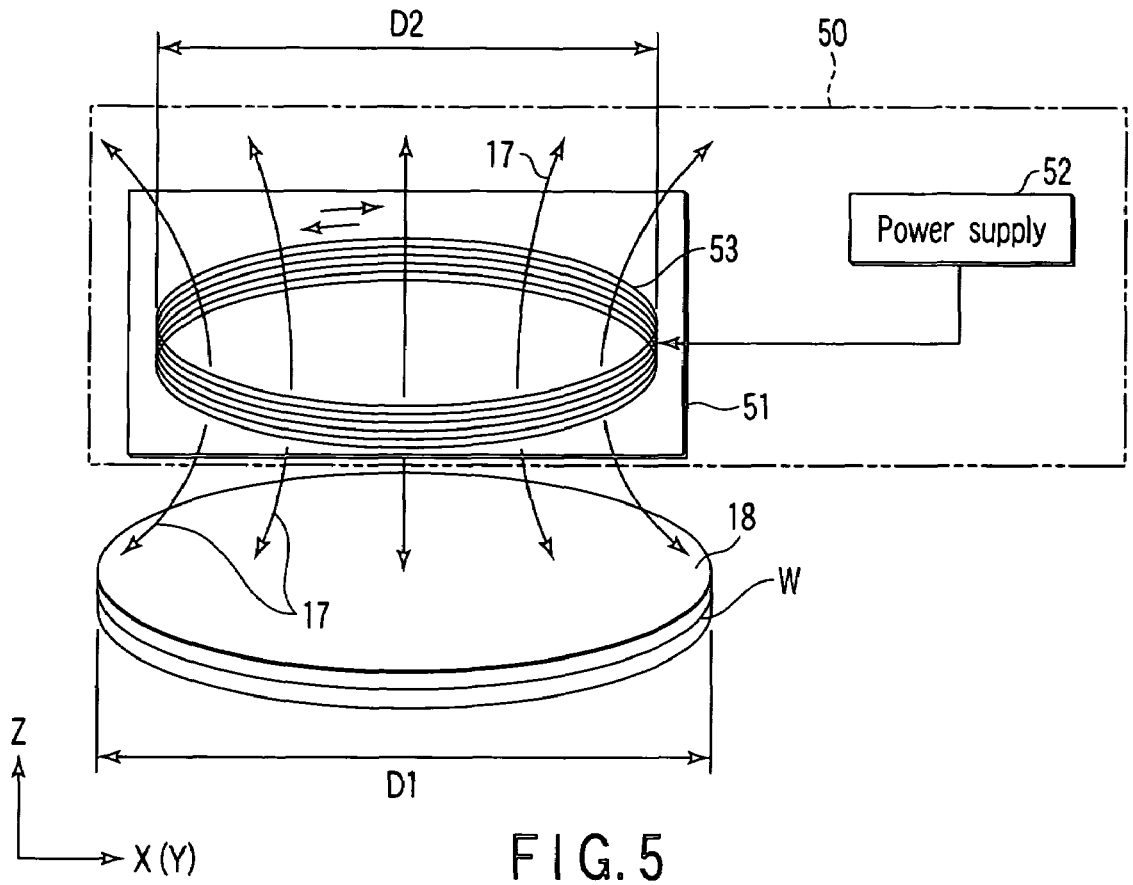
FIG. 5 is a block diagram schematically showing the structure of magnetic field generating means.

A coil unit 51 of a magnetic field generating means 50 is provided between the wafer W on the table 24 and the cover 28 as shown in FIG. 4. As shown in FIG. 5, the coil unit 51 includes a coil 53 connected to an AC power supply 52, and it generates lines of magnetic flux 17 in the Z direction that is substantially normal to the surface (XY plane) of the wafer W. The power supply 52 is controlled by a controller unit 60 so as to supply electricity to the coil 53 only during the PEB process.

The cooling temperature adjusting member 40 is provided for the standby unit 22. The cooling temperature adjusting member 40 is designed to cool down the wafer W from the lower surface thereof after it is moved to the upper position above the table 24 by the lift pins 32. A Peltier device 41 is embedded in the cooling temperature adjusting member 40, and the Peltier device 41 is connected to a power supply 43. A heat radiating plate 42 is attached to a rear surface of the Peltier device 41. When electricity is supplied from the power supply 43 to the Peltier device 41, the temperature of its surrounding area is decreased to adjust the temperature of the wafer W to a predetermined temperature (for example, room temperature, about 23° C.). In place of the Peltier device 41, it is alternatively possible to form an internal flow path to circulate water, gas or the like of a predetermined constant temperature in the internal flow path.

The cooling temperature adjusting member 40 is connected to an air cylinder 46 via a rod 46a connected thereto. The air cylinder 46 is designed to move the cooling temperature adjusting member 40 horizontally, and more specifically, as driven by the air cylinder 46, the cooling temperature adjusting member 40 moves forward or backward with respect to the wafer W.

Further, the air cylinder 46 is supported to be movable in the Z-direction by an ascending/descending mechanism 44. The cooling temperature adjusting member 40 has a slit (not shown) in order to avoid mutual interference between itself and the three lift pins 32. This slit exhibits the following effect. That is, when the cooling temperature adjusting member 40 is moved towards the wafer W that is lifted to the upper position above the table 24 by the lift pins 32 in order make the cooling temperature adjusting member 40 approach the lower surface (rear surface) of the wafer W, the table 24 and the wafer W are shut off from each other in the region other than the slot, and in the state, the wafer W can be cooled down to adjust its temperature. During this period, the wafer W is thermally shut off from the table 24 by the cooling temperature adjusting member 40, and therefore there is no possibility that the wafer W is thermally affected by the table 24.

In this embodiment, the cylindrically shaped shutter 26 is moved up and down to form the treatment chamber 30 and release the table 24 to the outside; however, it is alternatively possible to move the cover 28 and table 24 up and down to form the treatment chamber 30 in place of moving the shutter 26 up and down or in addition thereto.

It is alternatively possible in place of the cylindrical shutter 26 to provide an opening for loading or unloading wafers in a side wall of the container that contains the table 24, together with a shutter that opens and closes the opening.

Further, in the embodiment, the cooling temperature adjusting member 40 is moved while supporting the wafer W with the lift pins 32 in order to cool down and adjust the temperature of the wafer W without bringing the wafer W and the cooling temperature adjusting member 40 into contact with each other. However, it is alternatively possible that a plurality of spacers 48 indicated by imaginary lines in FIG. 4 are mounted on the upper surface of the cooling temperature adjusting member 40, and the temperature of the wafer W is cooled down and adjusted in a proximity state in which the wafer W is brought as close as possible to the Peltier device 41.

Next, the magnetic field generating means 50 will be described with reference to FIG. 5.

The magnetic field generating means 50 is provided in an upper section of the heat treatment unit 21 (above the wafer W) and includes the coil unit 51 mounted opposite to the wafer W placed on the table 24. The coil 53 is contained in the box of the coil unit 51. The coil 53 is made of a high electro-conductive wire wound in a cylindrical manner, which is connected to the AC power supply 52 and a diameter D2 of the coil 53 is made smaller than a diameter D1 of the wafer W.

In this embodiment, the coil 53 is of a type manufactured by winding a wire a number of times (that is, a solenoid coil); however, the present invention is not limited to this type only, but the coil 53 may be of a singly wound type (single coil). This is because even a single coil in some cases, is able to place the entire surface of a wafer W in a magnetic field.

Further, in this embodiment, the coil unit 51 of the magnetic field generating means 50 is fixed to the frame of the heat treatment unit 21 so as to not to move. However, the present invention is not limited to this structure, but it is alternatively possible that the coil unit 51 is supported to be movable in each of X, Y and Z directions by the moving mechanism. Especially, when the Z-direction moving mechanism is added, the distance from the coil unit 51 to the wafer W can be changed, thereby making it possible to adjust the strength of the magnetic field affecting the wafer W.

In the magnetic field generating means 50, when electricity is supplied from the power supply 52 to the coil 53, the electrical current flows in a circular and helical manner in the coil 53. Consequently, such a magnetic filed as shown in the figure, that has the lines of magnetic flux 17 directed substantially in the Z direction can be generated. It should be pointed out that since the current flowing through the coil 53 is AC current, the direction of the flow is reversed periodically, and accordingly, the direction of the lines of magnetic flux 17 is reversed to follow the direction of the current flowing through the coil 53.

Here, the coil 53 is placed above the wafer W, and therefore during the operation of the magnetic field generating means 50, the wafer W and the resist applied to the surface of the wafer W are situated in the generated magnetic field. That is, as shown in the figure, the lines of magnetic flux 17 are generated to run in a direction substantially normal to the surface of the wafer W, and in the film thickness direction of the resist film 18.

The magnetic field generating means 50 is controlled by the controller unit 60 so as to continuously operate in the PEB process. It is preferable that the magnetic field generating means 50 is controlled to operate during a time period between a timing t1, where the heat generation by the heater 23 is started, and a timing t2, where, after the PEB process at a predetermined temperature (for example, 140° C.), the wafer W is placed on the cooling temperature adjusting member 40 to cool down the wafer W to a predetermined temperature (for example, 40° C.) (that is, a time period t1 to t2). In other words, when the temperature of the wafer W is a predetermined temperature (for example, 40° C.) or higher, the reaction of acid ($H^+$) in the resist is promoted and the protection group is attacked by the acid ($H^+$). During this period, the magnetic field generating means 50 is controlled to operate.

Thus, in the case where the temperature of the wafer W is a predetermined temperature (for example, 40° C.) or higher, and the magnetic field generating means 50 is controlled to operate, the reaction of the acid (H$^+$) is promoted in the resist 18a exposed in pattern as shown in FIG. 6A.

Since the resists 18 and 18a are situated in the magnetic field, the force of the magnetic field (the lines of magnetic flux 17) effects the acid (H$^+$), which comprises positive ions. Therefore, the positive ion (H$^+$) diffusing direction is limited to the direction of the lines of magnetic flux 17, that is, the Z direction shown in FIG. 6A (the direction normal to the surface of the wafer W). Further, since of the direction of the magnetic field reverses periodically, the diffusion of the positive ions (H$^+$) in the up and down directions in the resist can be equalized.

Consequently, the positive ions (H$^+$) do not diffuse in the horizontal direction (X or Y direction) as shown in the figure. Therefore, the line width of the circuit pattern is not excessively increased. Thus, when the mask pattern is designed to have a line width of a measurement d1, the line width of the measurement d1 can be achieved in the circuit pattern obtained as a result of the development as shown in FIG. 6B.

It should be noted that while the wafer W is being cooled down by the cooling temperature adjusting member 40, the operation of the magnetic field generating means 50 is stopped by the controller 60. Alternatively, when the temperature of the wafer W is cooled down to a predetermined level (for example, 40° C.) after the start of cooling down the wafer W by the cooling temperature adjusting member 40, the operation of the magnetic field generating means 50 is stopped by the controller 60. Thus, a possible excessive chemical amplification reaction in the resist 18 or 18a can be inhibited.

As described above, according to this embodiment, the magnetic field generating means 50 provided in the heat treatment device 20 is operated in the PEB process, and thus the direction of the diffusion of the acid (H$^+$) in the resist 18a subjected to the exposure can be controlled.

More specifically, during the heat treatment, the acid (H$^+$), which comprises generated positive ions, is acted upon in the direction of the lines of magnetic flux 17. Therefore, the positive ions (H$^+$) can be controlled such that they are not diffused in the X direction or Y direction, but diffused in the Z direction normal to the surface of the wafer W. In this manner, an excessive amplification of the line width in the circuit pattern, which occurs in the PEB, can be inhibited, and therefore, after the development, a desired line width of the circuit pattern can be obtained, thereby making it possible to obtain a very fine circuit pattern.

Figure 7:
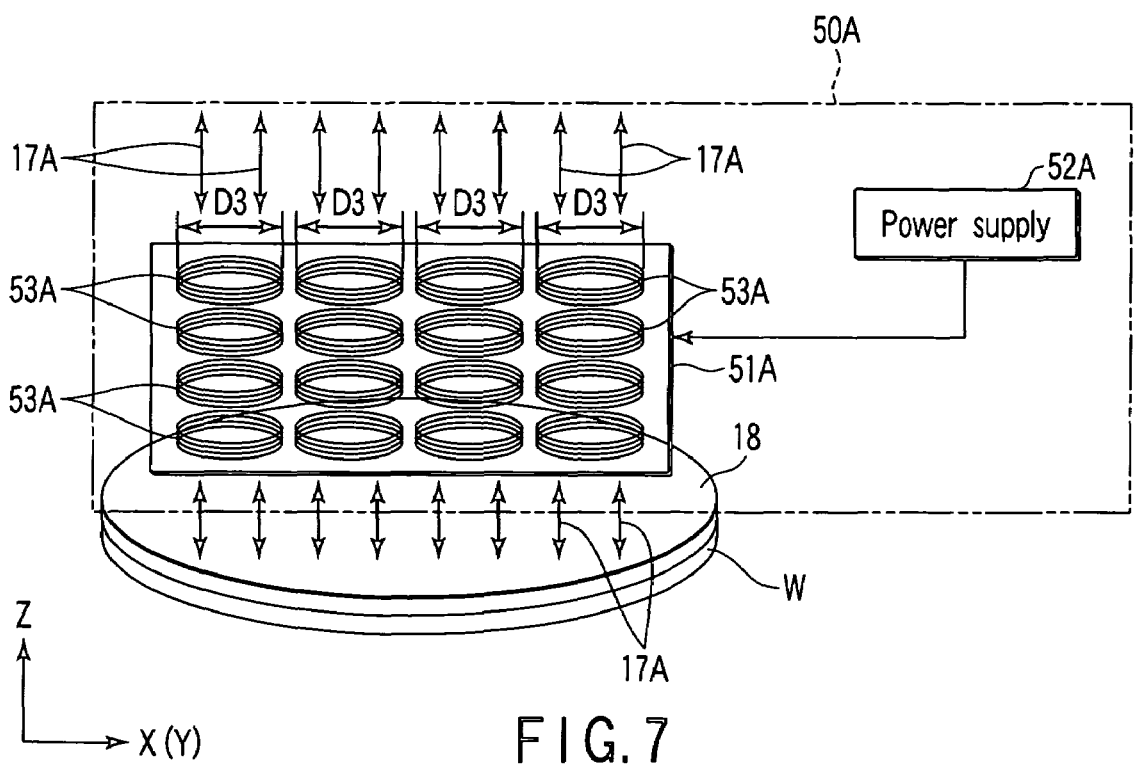
FIG. 7 is a block diagram schematically showing the structure of the magnetic field generating means according to another embodiment of the present invention.

Next, a magnetic field generating means 50 of another embodiment will now be described with reference to FIG. 7. The explanations for the overlapping sections of this embodiment with the above-described embodiment will be omitted.

A magnetic field generating means 50A of this embodiment comprises a coil unit 51A that includes a plurality of small coils 53A. The small coils 53A are arranged regularly in a square matrix manner within the coil unit 51. In the example shown in this figure, smalls coils 53A are arranged in a matrix of 4 in the vertical direction and 4 in the horizontal direction, and thus a total of 16 small coils 53A are arranged. A diameter D3 of each small coil 53A is sufficiently smaller than a diameter D1 of the wafer W, and it is sufficiently smaller than the diameter D2 of the coil 53 of the above-described embodiment as well. For example, the diameter D3 of each small coil 53A can be set 10% or less of the diameter D1 of the wafer W.

Alternating currents are supplied in a synchronous manner from a power supply 52A to each coil 53A at the same timing. In other words, the supply of electricity here is controlled so that the currents flow in all of the coils 53A in the same direction at all times.

Thus, all of the coils 53A generate magnetic fields as the electrical currents flow therethrough. Here, the directions of the magnetic fields (lines of magnetic flux 17A) are the same at all times, thereby avoiding the cancellation of magnetic fields of an adjacent pair of coils 53A.

As described above, with such a structure that a plurality of small coils 53A are arranged in a regular manner, the strength and flux density of the lines of magnetic 17A are made uniform in the entire surface of the wafer W. Therefore, a magnetic field can be applied to the resist 18 or 18a on the wafer W in a uniform fashion with respect to its plane.

In this embodiment, a total of 16 (a matrix of 4×4) coils 53A are used to generate a magnetic field; however, the present invention is not limited to this structure. The number of coils may be fewer or more than that. Further, the arrangement does not necessarily have to be a square matrix, but they may be arranged in a coaxial manner.

Further, a preferable operation of the embodiment is that the magnetic field generating means 50 is controlled to operate from the start of the heat generation by the heater 23 for the heat treatment to the point where, after the PEB process at a predetermined temperature (for example, 140° C.), the wafer W is placed on the cooling temperature adjusting member 40 to cool down the wafer W to a predetermined temperature (for example, 40° C.). However, the present invention is not limited to this structure, but it is alternatively possible that the magnetic field generating means 50 is controlled to operate only while the wafer W is being heated by the heater 23.

Further, this embodiment presents a case where the magnetic field is generated by supplying alternating currents to the coils, and the direction of the magnetic field is periodically reversed due to the properties of the alternating current, that is, the size and direction of the currents are changed at a certain period of time. However, the present invention is not limited to this structure, but it is alternatively possible that the current supplied to each coil may be a direct current. In the case, the direction of the flow of the direct current from the power supply is periodically or non-periodically changed to forcibly reverse the direction of the magnetic field in accordance with the direction of the flow of the direct current.

Furthermore, this embodiment presents such a structure that the magnetic field is generated by supplying currents to the coils. However, the magnetic field generating means of the present invention is not limited to this structure. In other words, the generating means may be any functional member that can generate the magnetic field in a direction substantially normal to the surface of the wafer W and reverse the direction of the magnetic field, and for example, a magnet may be employed.

Still furthermore, this embodiment presents a case where the coils of the magnetic field generating means are situated above the wafer W; however, the present invention is not limited to this structure, but it is alternatively possible that the coils may be situated underneath the wafer W. In other words, magnetic field generating members (such as coils and magnets) may be arranged above or underneath a substrate to be processed (wafer).

Still furthermore, this embodiment presents an example of the entire structure of the resist application development processing system as shown in FIG. 3; however the present invention is not limited to this structure.

Still furthermore, this embodiment presents a case where the KrF resist film is formed by applying it to a wafer W; however, the present invention is not limited to this structure, but it is alternatively possible that the present invention is applied to a heat treatment device in which a to-be-treated substrate coated with a chemically amplified resist such as an ArF resist is subjected to heat treatment.

Possible examples of the process material of the present invention, besides the photoresist, are an interlayer insulating film material, a dielectric material and a wiring material. Further, the substrate to be treated in the present invention is not limited to a semiconductor wafer, but it may be a CD substrate, a glass substrate, a photomask, or a printed circuit board.

The present invention can be applied to a heat treatment device that subjects a substrate coated with a processing solution, to a heat treatment, and it can be suitably employed in the manufacture of semiconductor devices, electronic devices, and the like.

According to the present invention, the chemical reaction of the processing solution is controlled and thereby a circuit pattern of a desired line width can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A heat treatment device for baking a chemically amplified process material film containing an acid ($H^+$) generator, the device comprising:
   a supporting unit that supports a substrate containing the process material film;
   a heating unit that heats the substrate supported by the supporting unit;
   a magnetic field generating unit that generates a magnetic field of lines of magnetic flux directed in a film thickness direction of the process material film and reverses the direction of the lines of magnetic flux in the magnetic field; and
   a control unit that controls the magnetic field generating unit to generate the magnetic field acting on the process material film at least while the substrate is being heated by the heating unit.

2. The heat treatment device according to claim 1, wherein the magnetic field generating unit further comprises: a coil arranged above or underneath the substrate; and a power supply that supplies an electrical current to the coil.

3. The heat treatment device according to claim 2, further comprising: a cooling unit that receives the substrate heated by the heating unit and cools down the substrate,
   wherein the control unit stops operation of the magnetic field generating unit while the substrate is being cooled down by the cooling unit.

4. The heat treatment device according to claim 2, further comprising: a cooling unit that receives the substrate heated by the heating unit and cools down the substrate,
   wherein the control unit stops operation of the magnetic field generating unit when the substrate is cooled down to a predetermined temperature after starting of cooling-down of the substrate by the cooling unit.

5. The heat treatment device according to claim 2, wherein the magnetic field generating unit includes a single coil.

6. The heat treatment device according to claim 2, wherein the magnetic field generating unit includes a plurality of coils.

7. The heat treatment device according to claim 1, further comprising: a cooling unit that receives the substrate heated by the heating unit and cools down the substrate,
   wherein the control unit stops operation of the magnetic field generating unit while the substrate is being cooled down by the cooling unit.

8. The heat treatment device according to claim 1, further comprising: a cooling unit that receives the substrate heated by the heating unit and cools down the substrate,
   wherein the control unit stops operation of the magnetic field generating unit when the substrate is cooled down to a predetermined temperature after starting of cooling-down of the substrate by the cooling unit.

9. A heat treatment method of baking a chemically amplified process material film containing an acid ($H^+$) generator before exposure but after development, the method comprising:
   (a) heating a substrate containing the process material film; and
   (b) generating a magnetic field of lines of magnetic flux directed in a film thickness direction of the process material film and reversing the direction of the lines of magnetic flux in the magnetic field, thereby making the magnetic field act on the process material film at least while the substrate is being heated by the heating unit.

10. The heat treatment method according to claim 9, wherein in the step (b), an electrical current is supplied to a coil arranged above or underneath the substrate, thereby generating the magnetic field.

11. The heat treatment method according to claim 10, wherein the magnetic field is generated by a single coil.

12. The heat treatment method according to claim 10, wherein the magnetic field is generated by a plurality of coils.

13. The heat treatment method according to claim 10, wherein after the step (b), the generation of the magnetic field is stopped and the substrate is cooled down to a predetermined temperature.

14. The heat treatment method according to claim 10, wherein after the step (b), the substrate is cooled down and the generation of the magnetic field is stopped when the substrate is cooled down to a predetermined temperature.

15. The heat treatment method according to claim 9, wherein after the step (b), the generation of the magnetic field is stopped and the substrate is cooled down to a predetermined temperature.

16. The heat treatment method according to claim 9, wherein after the step (b), the substrate is cooled down and the generation of the magnetic field is stopped when the substrate is cooled down to a predetermined temperature.

* * * * *